(12) United States Patent
Terdan et al.

(10) Patent No.: US 8,093,882 B2
(45) Date of Patent: *Jan. 10, 2012

(54) LOW HEAT DISSIPATION I/O MODULE USING DIRECT DRIVE BUCK CONVERTER

(75) Inventors: Dale R. Terdan, Concord Township, OH (US); Xiaofan Chen, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/870,048

(22) Filed: Aug. 27, 2010

(65) Prior Publication Data

US 2010/0320990 A1    Dec. 23, 2010

Related U.S. Application Data

(63) Continuation of application No. 11/680,228, filed on Feb. 28, 2007, now Pat. No. 7,804,287.

(51) Int. Cl.
*H02M 3/156* (2006.01)

(52) U.S. Cl. .................. 323/351; 323/282; 323/286

(58) Field of Classification Search .............. 307/24; 323/267, 271, 282, 285, 286, 351; 363/65, 363/72

See application file for complete search history.

(56) References Cited

U.S. PATENT DOCUMENTS

| | | | | |
|---|---|---|---|---|
| 4,253,055 A | * | 2/1981 | Gatten | 323/284 |
| 5,952,733 A | * | 9/1999 | Johnston | 307/44 |
| 5,973,942 A | * | 10/1999 | Nelson et al. | 363/21.01 |
| 6,472,854 B2 | * | 10/2002 | Ootani | 323/272 |
| 6,580,180 B2 | * | 6/2003 | Tamai et al. | 307/10.1 |
| 6,919,715 B2 | * | 7/2005 | Muratov et al. | 323/285 |
| 7,345,378 B2 | * | 3/2008 | Pearce | 307/24 |
| 2005/0231182 A1 | * | 10/2005 | Huisenga et al. | 323/282 |
| 2006/0164055 A1 | * | 7/2006 | Hata et al. | 323/282 |
| 2006/0273776 A1 | * | 12/2006 | Smart et al. | 323/304 |
| 2006/0284609 A1 | * | 12/2006 | Weng et al. | 323/286 |

* cited by examiner

*Primary Examiner* — Adolf Berhane
*Assistant Examiner* — Fred E Finch, III
(74) *Attorney, Agent, or Firm* — Boyle Fredrickson, S.C.; R. Scott Speroff; John M. Miller

(57) ABSTRACT

A current-loop output circuit for an industrial controller provides for low power dissipation and reduced part count by driving current loads of different resistances directly from a switched voltage source. Proper filtering and design of a feedback loop allows the necessary transient response times to be obtained.

10 Claims, 4 Drawing Sheets

LOW HEAT DISSIPATION I/O MODULE USING DIRECT DRIVE BUCK CONVERTER

CROSS-REFERENCE TO RELATED APPLICATIONS

This application is a continuation of U.S. patent application Ser. No. 11/680,228, filed on Feb. 28, 2007 now U.S. Pat. No. 7,804,287.

BACKGROUND OF THE INVENTION

The present invention relates generally to industrial controllers and, in particular, to current-loop circuits used to connect industrial controllers to controlled equipment and processes.

Two wire, current-loop circuits are used to provide electrical signals to a variety of industrial devices, for example, valve actuators or meters. Such circuits typically produce a defined current output, generally having an on state from 4-20 mA, according to a received control signal. By controlling output current instead of output voltage, changes in resistance caused by different lengths of wire connecting the current-loop circuit to the load and variations in load resistance, are better accommodated.

A typical current-loop circuit may use a current mirror circuit providing a controllable current source that generates the 4-20 mA signal based on the control signal. The current source is supplied with power from a voltage supply, commonly referred to as the compliance voltage, having a voltage value sufficient to drive the peak current required across the range of expected loads. For example, the loads may range in resistance from approximately 750 ohms for a solenoid valve to approximately 0 ohms for a panel meter. To provide adequate range of currents for these different loads, typical loop driving circuits are provided with compliance voltage sources of at least 24 volts.

While the original current-loop circuits operated in a binary mode, current-loops are also used to provide for "analog" control of current providing any current within a predetermined range of currents.

The power dissipated by a current source used in a current-loop driver will depend on the excess compliance voltage beyond the voltage needed to provide the desired current output. Thus, while it is desirable to have a high compliance voltage to provide high current outputs to high resistance loads, such high compliance voltages can produce high power dissipation in the current drive circuits when higher currents are output or lowered resistance loads are used.

One solution to this dilemma is to provide the current source, typically a transistor that is powered by a multi-mode power supply providing one or more different compliance voltages or a continuous range of compliance voltages. The transistor provides rapid current control and the power supply is switched between voltages at a slower rate depending on the amount of excess compliance voltage for the given current that is required. U.S. patent application 2006/0066379, filed Mar. 30, 2006, assigned to the assignee of the present invention and hereby incorporated by reference, describes such a system. In this system, the power supply is a boost converter, operating with very low power dissipation, to provide a range of compliance voltages to a field-effect transistor (FET) that provides the current control. The particular compliance voltage level to be used is determined by comparing the voltage dropped across the FET against the voltage drop across the load so that the compliance voltage may be tailored to the particular resistance of the load and the desired current level.

SUMMARY OF THE INVENTION

The present inventors have determined that a synchronous "buck converter", when used as power supply, can provide compliance voltages that can be changed fast enough, even after the necessary filtering, for direct current control for an I/O current-loop circuit, eliminating the need for a current control transistor and the heat dissipation of this element. The reduced heat dissipation allows high-density I/O modules.

Specifically then, the present invention provides a current-loop input/output module for an industrial control including at least one output circuit with load terminals connectable to a load and a control input receiving a control value from the industrial control indicating a desired current to the load. A current sensor provides a current value measuring current received by the load through the load terminals and a feedback circuit receives the control value and the current value to provide an error output. A switching circuit having at least one solid state switch receives the error output and a one supply voltage, and based on the control input periodically connects the supply voltage through an inductor to a load terminal to control the current to the load according to the control value. When the supply voltage is not connected to the inductor a diode or second solid state switch continues the current to the load terminal. All the solid state switches of the switching device operate exclusively in a switching mode being driven to either fully on or fully off states, and current from the switching circuit connects to the load terminal without passing through any additional solid state switching elements not operated in a switching mode.

It is thus one aspect of at least one embodiment of the invention to provide a current-loop circuit with low power dissipation and low parts count. Direct feedback control of the compliance voltage eliminates the needs for a power dissipating current mirror operating in a non-switching mode.

The switching circuit may include a low pass filter attenuating current flow at a frequency of switching of the switching circuit.

It is another aspect of at least one embodiment of the invention to provide for a compliance voltage with low ripple without significantly increasing the power dissipation.

The low pass filter may include multiple stages and the feedback circuit may further receive a signal from before at least one of the multiple stages to provide the error output.

It is another aspect of at least one embodiment of the invention to provide for a sophisticated feedback control of the switching circuit that provides rapid transient response from a DC power supply.

The current sensor may be positioned after the filter.

It is another aspect of at least one embodiment of the invention to provide a stable current feedback signal suitable for feedback control.

The switching circuit may be a buck converter controlling a duty cycle of switching of a supply voltage to the load.

It is thus another aspect of at least one embodiment of the invention to use a switching circuit that can provide for rapid changes in current. The buck converter provides reduced high frequency output that allows the design of a filter that is consistent with a need for high transient response.

The switching circuit may include a first solid-state switching device connected from the supply voltage through an inductor to the load terminal and a second solid state switching device connected from a ground through the same inductor to the load terminal, the switching devices being activated alternately.

It is thus another aspect of at least one embodiment of the invention to provide a switching circuit that actively pulls the output either high or low for rapid transient response. This is accomplished by the solid state switching device connected to ground pulling current from the load terminal and transferring that current to the supply voltage when the first solid state switch is subsequently turned on.

The invention may further provide a housing holding multiple output circuits.

It is another aspect of at least one embodiment of the invention to provide a circuit having both reduced part count and heat dissipation to allow multiple circuits to be packaged in an extremely compact I/O module or together on an integrated circuit.

These particular features and advantages may apply to only some embodiments falling within the claims and thus do not define the scope of the invention.

DETAILED DESCRIPTION OF THE PREFERRED EMBODIMENT

Figure 1:
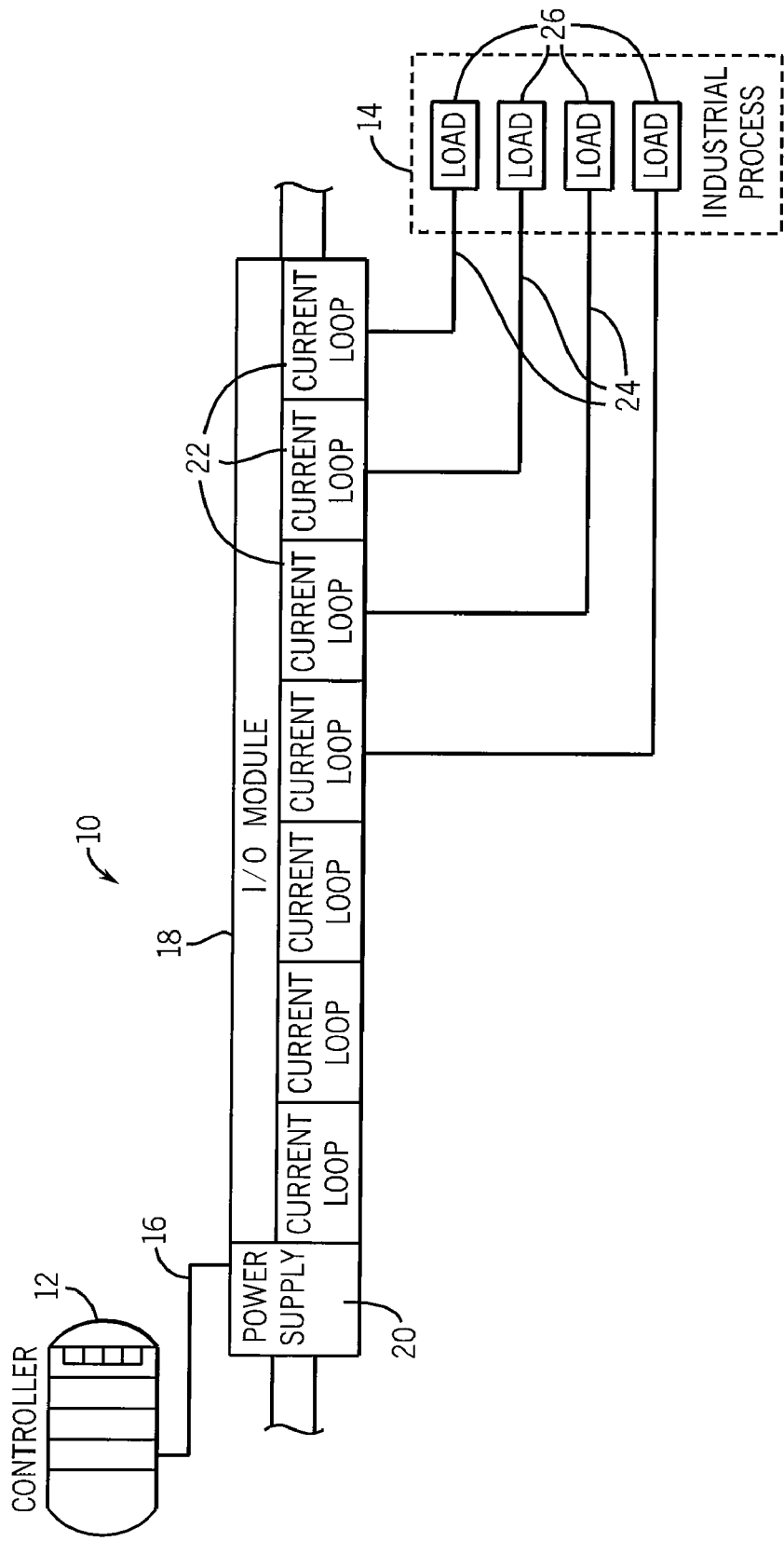
FIG. 1 is a block diagram of an industrial control system suitable for use with the present invention showing an I/O module having multiple current-loop circuits.

Referring now to FIG. 1, an industrial control system 10 may include a controller 12, for example, executing a stored program for the control of an industrial process 14 or the like.

The controller 12 may provide for local I/O modules (not shown) or may provide a network connection 16 to a remote I/O module 18. The I/O modules 18 may include a power supply 20 and one or more current-loop circuits 22. Each current-loop circuit 22 may provide an electrical connection 24 to a load 26 such as actuators or sensors connected to the industrial process 14.

Figure 2:
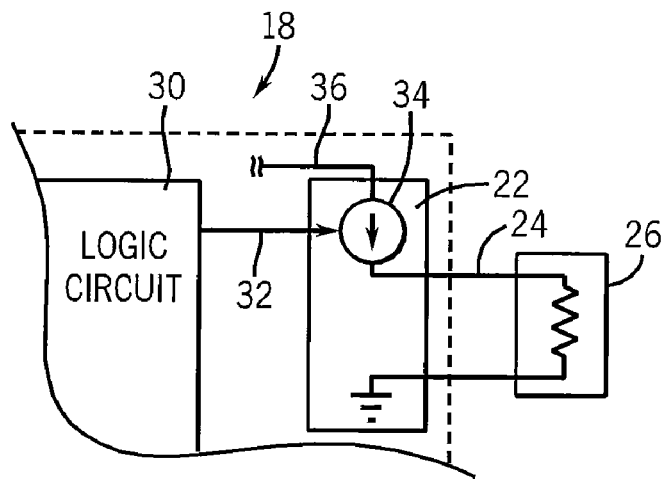
FIG. 2 is a fragmentary schematic representation of a prior art current-loop circuit showing a non-switching mode transistor operating as a current source to drive a load.

Referring now to FIG. 2, in a prior art I/O module 18, logic circuitry 30 provides a command signal 32, indicating a desired current to be output over connection 24 to load 26. The command signal 32 is received by a linear current source 34, which may, for example, be an FET receiving a compliance voltage 36 from the power supply 20 (shown in FIG. 1) and operating in a non-switching mode to provide a desired current level (e.g. 20 milliamps) when the command signal 32 is high. For an arbitrary low load resistance for load 26 and a high compliance voltage 36 substantial power dissipation occurs in linear current source 34.

Figure 3:
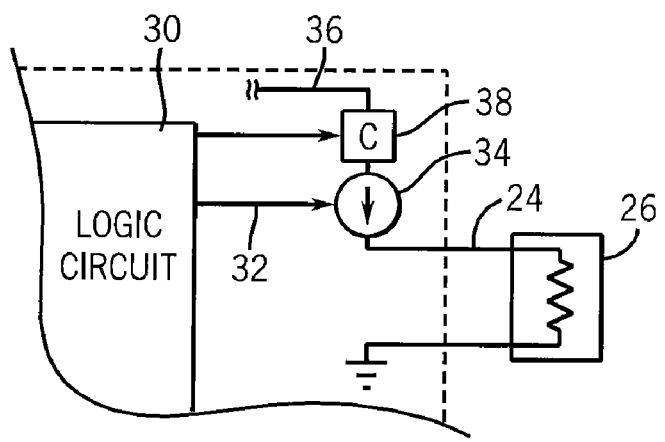
FIG. 3 is a figure similar to that of FIG. 2 showing a prior art improvement over the current-loop of FIG. 2 in which a compliance voltage feeding the non-switching mode transistor is adjusted to reduce power dissipation in the transistor.

Referring now to FIG. 3, and as taught in U.S. patent 2006/0066379 entitled: "Current-Loop Drive Module With Dynamic Compliance Voltage", filed on Sep. 30, 2004 and hereby incorporated by reference, the circuit of FIG. 2 may be improved by the introduction of an adjustable compliance voltage converter 38 between the compliance voltage 36 and the controllable linear current source 34. In this embodiment the amount of power dissipated in the linear current source 34 is monitored so that for loads 26 with low resistance, the voltage output of the compliance voltage module 38 is reduced thereby reducing the power dissipation in the linear current source 34. The compliance voltage converter 38, which varies the voltage provided to the linear current source 34, uses a "boost converter" whose power dissipation is low and largely independent of the amount of voltage output by the compliance voltage converter 38.

Figure 4:
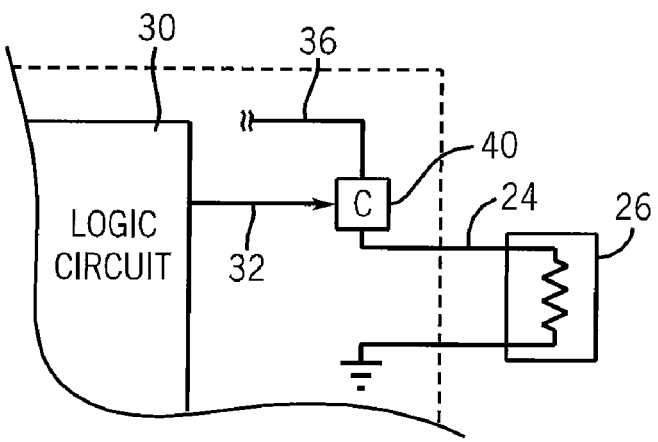
FIG. 4 is a figure similar to that of FIGS. 2 and 3 showing a current-loop circuit of the present invention in which a switching mode compliance voltage source directly drives the load.

Referring now to FIG. 4, the present invention provides an improvement over the circuit of FIGS. 2 and 3 by eliminating the controllable linear current source 34 and providing an adjustable voltage directly from a compliance voltage module 40 to the load 26, adjusting that voltage rapidly to provide the desired current flow through the load 26. This eliminates the need for the linear current source 34 and eliminates the heat dissipated in linear current source 34. Critical to this ability is the recognition that a simple circuit could be used to implement compliance voltage module 40 that would also provide rapid transient response comparable to the linear current source 34.

Figure 5:
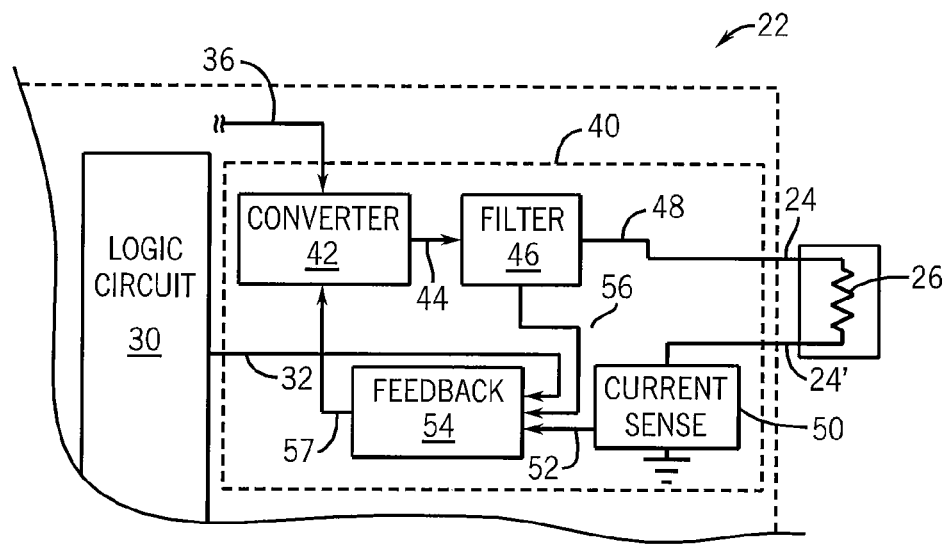
FIG. 5 is a detailed block diagram of the circuit of FIG. 4 showing a synchronous buck converter such as forms the switching mode compliance voltage source of FIG. 4 and configured to provide high transient response.

Referring now to FIG. 5, the compliance voltage module 40 may comprise four principal components. The first is a synchronous buck converter 42 receiving the compliance voltage 36 and producing a switched output 44 having an average value suitable for producing a desired current flow through connection 24. Because converter 42 operates in a switched mode, either connecting compliance voltage 36 directly to switched output 44 or connecting switched output 44 to ground, the solid state switching devices of the converter 42 provide extremely low power dissipation. The switched output 44, having a desired average voltage, is received by a multistage filter 46 having series connected low-pass networks of a type well known in the art, using reactive components (e.g. capacitors and inductors) having essentially no power dissipation and low resistance resistors providing minimal power dissipation. Thus the multistage filter 46 operates as a low pass filter, blocking frequency components at and around the switching frequency of the converter 42 which are generally many octaves above the desired transient response of the signal on connection 24 to the load 26.

The multistage filter 46 provides an output voltage 48 that is connected to the load 26 to provide a desired current flow throughout a range of possible load resistances as will be described. Precise adjustment of the voltage 48, to obtain the desired current flow through the connection 24, is obtained by means of a feedback mechanism that uses a current signal measured by a current sensing resistor 50. The current sensing resistor 50 is in series with the current that has passed through the load 26 and is returned on a return connection 24' on the way to ground.

The current signal 52 from the current sensing resistor 50 is provided to a feedback error block 54 which receives the command signal 32 from the logic circuitry 30 and determines whether the voltage 48 is too high or too low to produce the desired current as determined from the current signal 52.

The current feedback from the current sensing resistor 50 has some phase lag as a result of the action of the multistage filter 46 and this phase lag may impair the transient response of the system. Accordingly an anticipating signal 56 from an early stage in the multistage filter 46 is also used by the feedback error block 54 to provide improved transient response.

An error signal 57, output from the feedback error block 54, indicates whether voltage 48 is too high or too low, and is provided to the converter 42 to adjust the switched output 44 completing the feedback loop.

Figure 7:
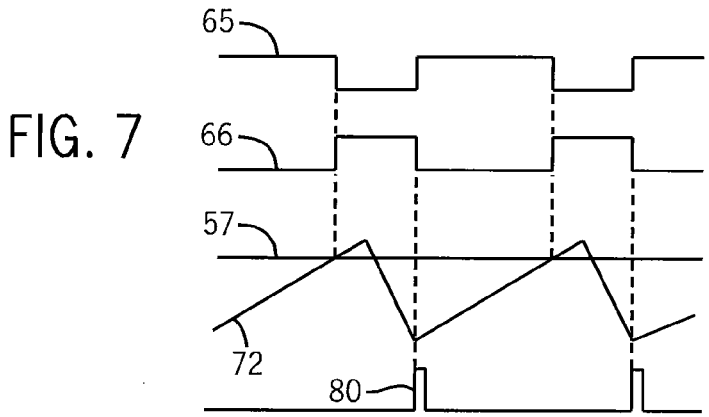
FIG. 7 is a set of plots of voltage versus time for different points in a schematic of FIG. 6.
Figure 6:
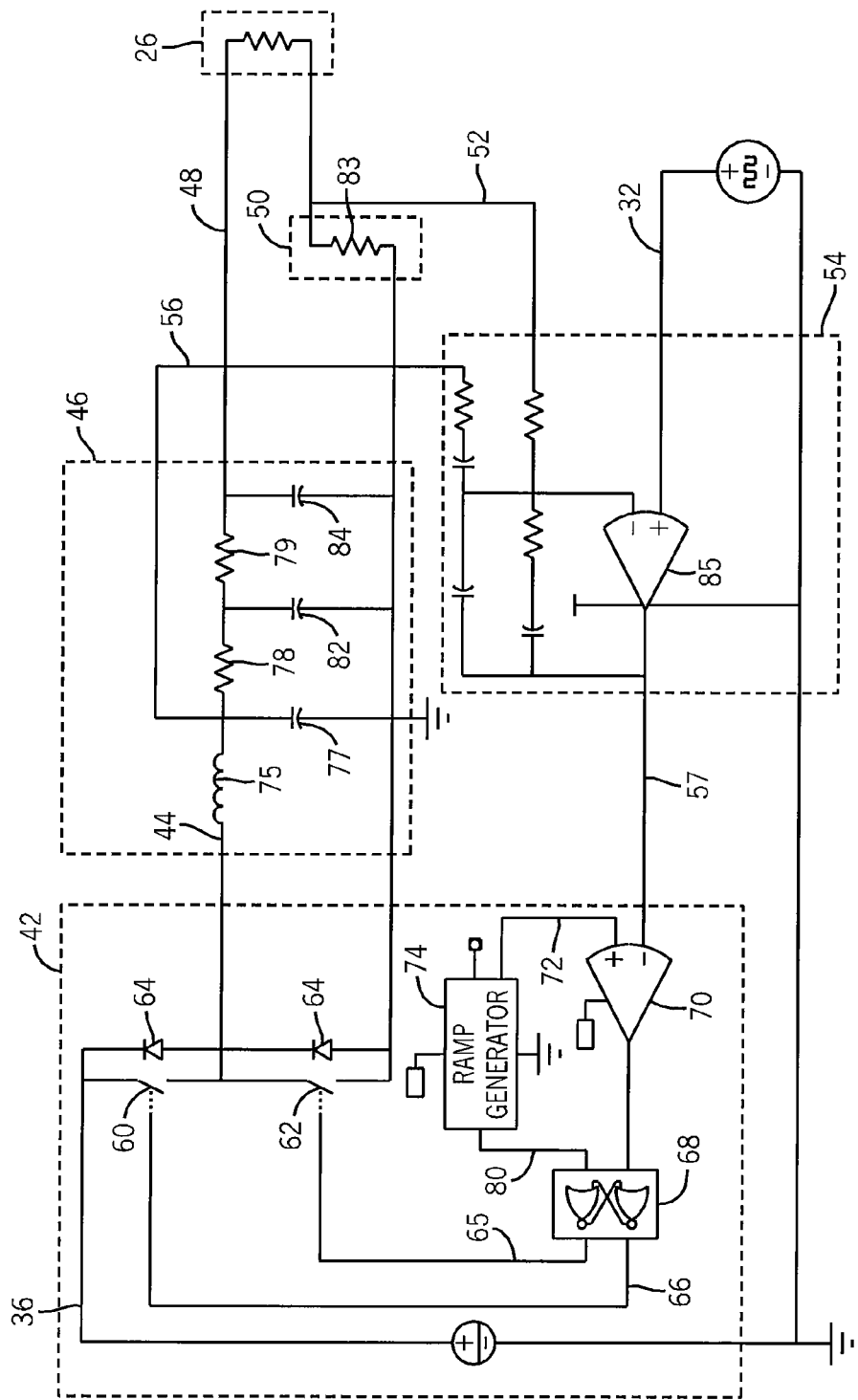
FIG. 6 is a schematic diagram of the converter of FIG. 5.

Referring now to FIGS. 6 and 7, the synchronous buck converter 42 may provide for a first and second solid-state switch 60 and 62, for example, being field effect switches, with solid-state switch 60 receiving the compliance voltage 36 and connecting to a junction point being the switched output 44 of the synchronous buck converter 42 and the switch 62 connecting from the switched output 44 to ground. Fly-back diodes 64 may be connected in parallel with each of the switches 60 and 62 as understood in the art.

Each of switches 60 and 62 may be operated alternately by a "Q" output 65 and "Q-not" output 66 of a flip-flop 68. The flip-flop 68 thus ensures that only one of switches 60 and 62 will be activated at a time preventing a possible short circuit from compliance voltage 36 to ground.

The flip-flop 68 is "set" by the output of a comparator 70 which receives the error signal 57 described above and compares it to a ramp wave 72 produced by ramp generator 74. Referring now to FIG. 7 when the ramp wave is greater than the error signal 57, for example, at the time 76, the output of a comparator 70 will rise, setting the flip-flop 68 and causing its Q output 65 to rise and it's Q-not output to fall. Correspondingly this causes switch 60 to turn on and switch 62 to turn off.

Ramp generator 74 also produces a reset pulse 80 when the ramp resets which also resets the flip-flop 68 causing the states of Q and Q-not outputs to reverse, that is, the Q output 65 to fall, and the Q-not output to rise. It will be understood that the higher the error signal 57, indicating that insufficient current is flowing through the load 26, the longer the duty cycle of the Q output 65 and thus the more time that switch 60 is closed increasing the average voltage of the switched output 44.

The switched output 44 of the converter 42 is a square wave and is received by multistage filter 46 described above and consisting of a first stage being a series inductor 75 shunted by capacitor 77 to ground. The anticipating signal 56 to be described below is taken after this first stage at the junction of the inductor 75 and capacitor 77. The next two stages consist of series resistors 78 and 79 shunted respectively by capacitors 82 and 84 with the first series resistor connected to the junction of the inductor 75 and capacitor 77 and the second series resistor connected to the junction of the resistor 78 and capacitor 82. The junction of the resistor 79 and capacitor 84 forms the output voltage 48. In the preferred embodiment, resistor 79 is replaced with a short and capacitor 84 is omitted.

The output voltage 48 from the filter is received by the load 26 and passes through the current sensing resistor 50 which is a precision low ohmage resistor 83. The voltage across this resistor 83 forms a current signal 52 and is received by an integrator formed of an operational amplifier 85 having a noninverting input receiving command signal 32, and an inverting input receiving the sum of the current signal 52 and anticipating signal 56 each through a gain setting resistance and the latter through a high pass filter selected for the appropriate transient response. The inverting input of the operational amplifier 85 is shunted by a capacitive network producing an integrated output providing the error signal 57.

Figure 8:
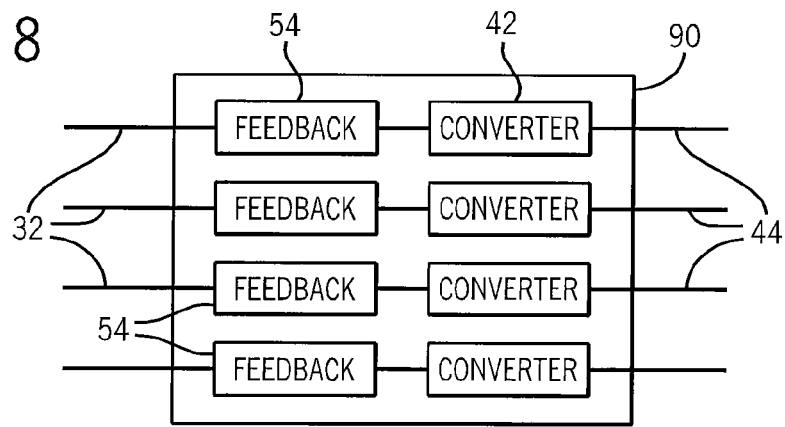
FIG. 8 is a block diagram of the principle components of the invention as may be incorporated into a single integrated circuit.

Referring now to FIG. 8, each of the elements of the buck converter 42 and the feedback error block 54 may be placed on a single integrated circuit 90 for multiple current-loop circuits 22. By eliminating devices operating in the non-switched region, all the switch elements may be on the integrated circuit 90 significantly improving the manufacturability of the current-loop circuits 22. For purposes of isolation, different compliance voltage module 40 may be on different integrated circuits 90.

While the present invention has been described with respect to a digital command signal 32 it will be understood that the identical circuit may be used to provide for analog current-loop control as well simply by varying the command signal 32 among different ranges of voltage rather than simply between two voltages as may be provided by a digital to analog converter communicating with the logic circuitry 30.

It is specifically intended that the present invention not be limited to the embodiments and illustrations contained herein. For this reason, the invention may include modified forms of those embodiments including portions of the embodiments and combinations of elements of different embodiments as come within the scope of the following claims.

We claim:

1. A current loop circuit for an industrial controller providing a controlled current output signal, the current loop circuit comprising:
    a first input configured to receive a compliance voltage;
    a second input configured to receive a command signal from the industrial controller;
    an output connection configured to connect the controlled current output signal to a load device;
    a switched power converter having at least one switch responsive to a switching signal to selectively establish a conductive path between the first input and the output connection;
    a low pass filter having multiple stages connected in series between the switched power converter and the output connection;
    an anticipating signal representative of a current output from the switched power converter;
    a current sense device configured to generate a current signal representative of a current conducted through the load device;
    a feedback circuit generating an error signal dependent on the command signal, the anticipating signal, and the current signal; and
    a gating circuit generating the switching signal dependent on the error signal, wherein
    at least one of the multiple stages of the low pass filter includes an inductor, and
    the anticipating signal is generated before at least one of the multiple stages and after the stage including the inductor.

2. The current loop circuit of claim 1 wherein the command signal is selected such that the controlled current output signal is a 4-20 mA current to the load device.

3. The current loop circuit of claim 1 wherein the switched power converter is a buck converter.

4. The current loop circuit of claim 1 wherein the command signal corresponds to one of at least two predetermined current levels.

5. The current loop circuit of claim 4 wherein the industrial controller is configured to execute a stored program to control an industrial process and the command signal is calculated by the stored program.

6. In an industrial controller configured to provide a control signal corresponding to one of at least two predetermined current levels as an input to a plurality of current loop circuits, each current loop circuit providing a controlled current output signal and comprising:
- a logic circuit receiving the control signal from the industrial controller and generating a command signal;
- a load terminal configured to connect the controlled current output signal to a load device;
- a switched power converter having at least one switch responsive to a switching signal to selectively establish a conductive path between a compliance voltage and the load terminal;
- a low pass filter having multiple stages connected in series between the switched power converter and the load terminal, wherein at least one of the stages of the low pass filter includes an inductor;
- an anticipating signal generated after the stage of the filter including the inductor;
- a current sense device configured to generate a current signal representative of a current conducted through the load device;
- a feedback circuit generating an error signal dependent on the command signal, the anticipating signal, and the current signal; and
- a gating circuit generating the switching signal dependent on the error signal.

7. The current loop circuit of claim 6 wherein the industrial controller is configured to execute a stored program which determines the control signal for controlling at least a portion of a controlled process.

8. A method of regulating current supplied by a two-wire current loop circuit in response to a command signal generated by an industrial controller to control an industrial device, comprising the steps of:
- providing a switched power converter having a first input receiving a switching signal, a second input electrically connected to a compliance voltage, and an output electrically connected to the load device, wherein the switched power converter selectively establishes a conductive path between the compliance voltage and the industrial device responsive to the switching signal;
- filtering the current in the conductive path with a low pass filter having multiple stages, wherein at least one stage of the low pass filter includes an inductor;
- generating an anticipating signal after the stage of the filter having the inductor;
- measuring a current flowing through the load device;
- calculating an error signal based on the command signal, the anticipating signal, and the current; and
- generating the switching signal responsive to the error signal.

9. The method of claim 8 wherein the command signal corresponds to one of at least two predetermined current levels.

10. The method of claim 8 wherein generating the command signal further comprises the steps of:
- executing a program stored on the industrial controller to determine a desired control value for the load device; and
- converting the control value to the command signal with a logic circuit.

* * * * *